US006226858B1

(12) United States Patent
Matsumoto et al.

(10) Patent No.: US 6,226,858 B1
(45) Date of Patent: *May 8, 2001

(54) METHOD OF MANUFACTURING AN OXIDE SUPERCONDUCTOR WIRE

(75) Inventors: Kaname Matsumoto, Yokohama; Naoki Koshizuka, Narashino; Yasuzo Tanaka, Yokohama, all of (JP)

(73) Assignees: The Furukawa Electric Co., Ltd.; International Superconductivity Technology Center, both of Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/088,915

(22) Filed: Jun. 2, 1998

(30) Foreign Application Priority Data

Jun. 10, 1997 (JP) .................................................. 9-152410

(51) Int. Cl.[7] .................................................. H01L 39/24
(52) U.S. Cl. .......................... 29/599; 174/125.1; 428/469; 428/472.1; 428/697; 428/699; 505/230; 505/236; 505/237; 505/238; 505/701; 505/704
(58) Field of Search .................................. 505/230, 236, 505/237, 238, 239, 701, 704; 174/125.1; 29/599; 428/469, 472.1, 697, 699, 701, 702, 930

(56) References Cited

U.S. PATENT DOCUMENTS 5,712,001 * 1/1998 Fujii et al. ........................... 427/576
5,741,377 * 4/1998 Goyal et al. ......................... 148/512
5,872,080 * 2/1999 Arendt et al. ....................... 505/238

FOREIGN PATENT DOCUMENTS 0 392 659   10/1990  (EP) .

OTHER PUBLICATIONS

A. Ginsbach, R. Schneider, H.W. Grueninger, G. Grabe, "Growth of C–Axis Oriented YBaCuO Films on Oxidized Textured Ni Sheets and on (100) and (110) Oriented NiO Single Crystals", 1990 Applied Superconductivity Conference, Snowmass, Co. USA, *IEEE Transactions on Magnetics*, vol. 27, No. 2, Mar. 1991, pp. 1410–1413.
ISTEC Journal, vol. 8, No. 2, pp. 18–22, 1995.
ISTEC Journal, vol. 8, No. 2, pp. 44–46, 1995.
ISTEC Journal, vol. 8, No. 2, pp. 46–51, 1995.
Y. Iijima et al, "In–plane aligned $YBa_2Cu_3O_{7-x}$ thin films deposited on polycrystalline metallic substrates", Applied Physics Lett., vol. 60, No. 6, pp. 769–771, Feb. 10, 1992.
D.P. Norton et al, "Epitaxial $YBa_2Cu_3O_7$ on Biaxially Textured Nickel (001): An Approach to Superconducting Tapes with High Critical Current Desity", Science, vol, 274, pp. 755–757, Nov. 1, 1996.
A. Ginsbach et al, "Electrical and Structural Properties of $YBa_2Cu_3O_7$ Films On Poly and Single Crystalline Oxides of Cu and Ni", Physica C. 185–189, pp. 2111–2112, 1991.

* cited by examiner

*Primary Examiner*—Carl J. Arbes
(74) *Attorney, Agent, or Firm*—Frishauf, Holtz, Goodman, Langer, & Chick, P.C.

(57) ABSTRACT

A method of manufacturing a superconductor wire which comprises: rolling a polycrystalline metallic substrate; heating the rolled polycrystalline metallic substrate at a temperature of 900° C. or more in a non-oxidizing atmosphere, whereby obtaining a rolled textured structure which is oriented such that the [100] plane thereof is parallel with a rolled plane and the <001> axis thereof is parallel with a rolled direction; heating the polycrystalline metallic substrate of the rolled textured structure at a temperature of 1,000° C. or more in an oxidizing atmosphere, whereby forming an oxide crystal layer consisting essentially of an oxide of the polycrystalline metal; and forming an oxide superconductor layer on the oxide crystal layer.

18 Claims, 2 Drawing Sheets

METHOD OF MANUFACTURING AN OXIDE SUPERCONDUCTOR WIRE

BACKGROUND OF THE INVENTION

1. Field of the Invention

This invention relates to a superconductor wire using an oxide superconductor, and to a method of manufacturing such a superconductor wire.

2. Background of the Invention

The method of manufacturing a superconductor wire by making use of an oxide superconductor can be classified mainly into the following two kinds of methods. A first method includes the steps of filling a polycrystalline metallic sheath with an oxide superconductor powder, and drawing or rolling the sheath, whereby producing a tape-like wire. According to this method, the superconductor powder charged in the metallic sheath is drawn together with the metallic sheath thereby to form a continuous and uniform precursor of superconductor tape. This precursor is suitably heat-treated during or after the working thereby subjecting the oxide superconductor powder to a reaction, thus obtaining a tape-like wire of oxide superconductor.

A typical example of the tape-like superconductor wire to be obtained by this method is the one wherein a Bi-based oxide superconductor (Bi2212, Bi2223) is joined and covered by making use of a polycrystalline silver or silver alloy sheath (ISTEC Journal, Vol. 8, No. 2, 1995, pp. 46–51). This wire is not preferable, since the crystal orientation degree of c-axis of the oxide superconductor is about 90%, and the crystal matching of a-axis and b-axis is 60% or less. Due to these poor properties, the critical current density $J_c$ of the Bi2223 type wire under the conditions of 77 K and zero tesla is at most 4 to $6\times10^4$ A/cm$^2$. However, because of its high manufacturing speed of 100 m/h, this manufacturing method of wire is attractive with respect to an industrial viewpoint.

A second method comprises the steps of forming an intermediate layer controlled in crystal orientation on the surface of a continuous metallic tape, and forming an oxide superconductor on the surface of the intermediate layer. In this method, the intermediate layer plays an important role in particular. Namely, this method is featured in that the intermediate layer functions not only to suppress the diffusion reaction between the metallic layer and the oxide superconductor layer being formed, but also to easily control the orientation of the oxide superconductor layer formed thereon since the intermediate layer is already controlled in crystal orientation. As a result, the integrity between the crystal grains can be improved, whereby making it possible to easily achieve such a high critical current density that the other conventional methods have failed to achieve.

A typical example of the tape-like superconductor wire to be obtained by this method is the one wherein a stabilized zirconia (YSZ) controlled in crystal orientation is formed on a Hastelloy tape by means of an ion beam-assisted deposition (IBAD) method so as to obtain the stabilized zirconia which is orientated in c-axis and aligned in a- and b-axis (in-plane orientation), and then a Y123 (YBa$_2$Cu$_3$O$_{7-y}$)-based oxide superconductor thin film is formed on the stabilized zirconia by means of a laser ablation method. Since this tape-like wire is high in crystal matching degree of a- and b-axis, the critical current density $J_c$ thereof is as high as 0.5 to $1.0\times10^6$ A/cm$^2$ under the conditions of 77 K and zero tesla.

However, this method is defective in that the film-forming speed is as low as 0.001 to 0.01 m/h, thus raising many problems with respect to an industrial viewpoint in the manufacture of a continuous wire (Y. Iijima et al., Appl. Phys. Lett. Vol. 60 (1992) 769).

There is also known the RABiTS method which is similar to the aforementioned method (D. P. Norton et al., Science Vol. 274 (1996) 755). According to this method, a nickel tape which is textured-structured is formed at first by applying a rolling and a heat treatment to nickel metal, and then Ag or Pd is deposited on the surface of the textured-structured nickel tape by means of an electron beam deposition, or CeO$_2$ or YSZ is deposited on the surface of the textured-structured nickel tape by means of a sputtering method, thereby forming an in-plane-orientated intermediate layer. Subsequently, a Y123-based thin film is formed on the intermediate layer by means of a laser ablation method. Since the tape-like wire to be obtained by this method is also high in crystal matching degree of a- and b-axis, the $J_c$ thereof is as high as $0.7\times10^6$ A/cm$^2$ under the conditions of 77 K and zero tesla.

However, this method requires the repetition of a complicated process for forming a thin film in order to obtain the intermediate layer, thus inviting many problems when it is applied to the manufacture of actual wire, such as a high manufacturing cost and a low manufacturing speed of the wire. Further, although it is possible with the aforementioned methods to obtain a superconductor film of high $J_c$, the quality of the film may be deteriorated or a crack may be generated in the film as the thickness of the film is increased by making use of these methods, thus making it difficult to increase the $I_c$.

There is also reported a method wherein a nickel or copper tape is subjected to an oxidation treatment so as to form an oxide layer as an intermediate layer on the surface of the tape, and then an oxide superconductor layer is formed on this intermediate layer (A. Ginsbach et al., Physica CI85–189 (1991) 2111). This method is designed to utilize an oxide film which has been formed on the surface of a metallic tape by merely oxidizing the metallic tape as an intermediate layer which is equivalent to the aforementioned YSZ or CeO$_2$. Therefore, this method is suited for use in mass production and can be said to be a practical method.

However, the improvement in orientation of an oxide crystal is not taken into account in this method, so that the $J_c$ of the oxide superconductor layer formed on this oxide layer by means of a sputtering method is at most $1\times10^3$ A/cm$^2$, which is lower by about three digits (thousandth) as compared with the aforementioned high orientation tape wire.

There is also proposed a method wherein Ag is subjected to a rolling and a heat treatment so as to form a textured-structure therein, and then an oxide superconductor layer is directly formed on the surface of the textured-structured Ag (ISTEC Journal Vol. 8, No. 2, 1995, pp. 44–46). According to this method, the {100} plane of Ag which is in-plane-orientated can be obtained ultimately. It is reported that since the lattice constant of Ag is about 4.09 angstroms which is close to the lattice constant of the c-axis of the oxide superconductor crystal, it is possible to obtain an epitaxial film by growing an oxide superconductor by means of vapor phase growth on this crystal surface.

The tape wire to be obtained by making use of this method shows a critical current density $J_c$ of 1 to $10\times10^4$ A/cm$^2$ under the conditions of 77 K and zero tesla if a thallium-based oxide superconductor is employed. However, since it is inherently difficult to transform Ag into a textured structure, any further improvement of the orientation is not feasible. Further, since the melting point of Ag itself is about 960° C. in an air atmosphere, which is close to the melting point of the oxide superconductor, Ag may be melted in a film-forming method such as a liquid phase epitaxial method employing a high temperature of nearly 1,000° C. (ISTEC Journal Vol. 8, No. 2, 1995, pp. 18–22).

The superconductor wire employing a Bi2223 type superconductive material according to the aforementioned prior art is accompanied with a problem that $J_c$ under a condition of 77 K is low, so that the application thereof to a superconductor device to be actuated at 77 K is limited. Further, the IBAD method for manufacturing a Y123 type tape-like wire is also accompanied with problems that a process to be performed in vacuum is involved in the manufacture of an YSZ intermediate layer having a uniform crystal orientation, that since the method is based on a vapor phase method, the film-forming speed is low, and that the crystallinity is deteriorated as the film thickness is increased thereby to lower the value of $J_c$. Therefore, it is very difficult to manufacture a continuous tape-like wire for practical use by making use of these conventional techniques.

On the other hand, the conventional method of oxidizing the surface of nickel or copper and employing a resultant oxide layer formed on the metal as an intermediate layer is defective in that it is difficult to obtain a desired orientation in the Y123 type crystal, so that the $J_c$ cannot be improved. As for the utilizing the textured structure of silver, it is essentially difficult to obtain a textured structure of silver which is excellent in orientation, so that the $J_c$ cannot be increased. Moreover, since the melting point of silver is relatively low, a film-forming method which requires a high temperature cannot be applied to this case. Furthermore, since Ag can be easily softened, a sufficient strength for use as a wire cannot be obtained, thus being limited in end-use.

BRIEF SUMMARY OF THE INVENTION

Therefore, an object of the present invention is to provide an oxide superconductor wire comprising a superconductor film of high critical current density.

Another object of the present invention is to provide a method of manufacturing an oxide superconductor wire comprising a superconductor film of high critical current density, the method enabling such an oxide superconductor wire to be obtained more easily and at a higher manufacturing speed as compared with the conventional methods.

Namely, this invention provides a superconductor which comprises:

a polycrystalline metallic substrate having a rolled textured structure where the {100} plane thereof is parallel with a rolled plane and the <001> axis thereof is parallel with a rolled direction;

an oxide crystal layer consisting of an oxide of the polycrystalline metal which is formed on a surface of the polycrystalline metallic substrate; and an oxide superconductor layer formed on a surface of the oxide crystal layer;

wherein 90% or more of the {100} plane of the oxide crystal layer is inclined at most at an angle of not more than 10° to the surface of the polycrystalline metallic substrate.

This invention also provides a method of manufacturing a superconductor which comprises the steps of:

rolling a polycrystalline metallic substrate;

heating the roll-worked polycrystalline metallic substrate at a temperature of 900° C. or more in a non-oxidizing atmosphere, whereby obtaining a rolled textured structure which is orientated such that the {100} plane thereof is parallel with a rolled plane and the <001> axis thereof is parallel with a rolled direction (hereinafter referred to as {100} <001> orientation);

heating the polycrystalline metallic substrate of rolled textured structure at a temperature of 1,000° C. or more in an oxidizing atmosphere, whereby forming an oxide crystal layer consisting of an oxide of the polycrystalline metal wherein 90% or more of the {100} plane of the oxide crystal layer is inclined at most at an angle of not more than 10° to the surface of the polycrystalline metallic substrate; and forming an oxide superconductor layer on the oxide crystal layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
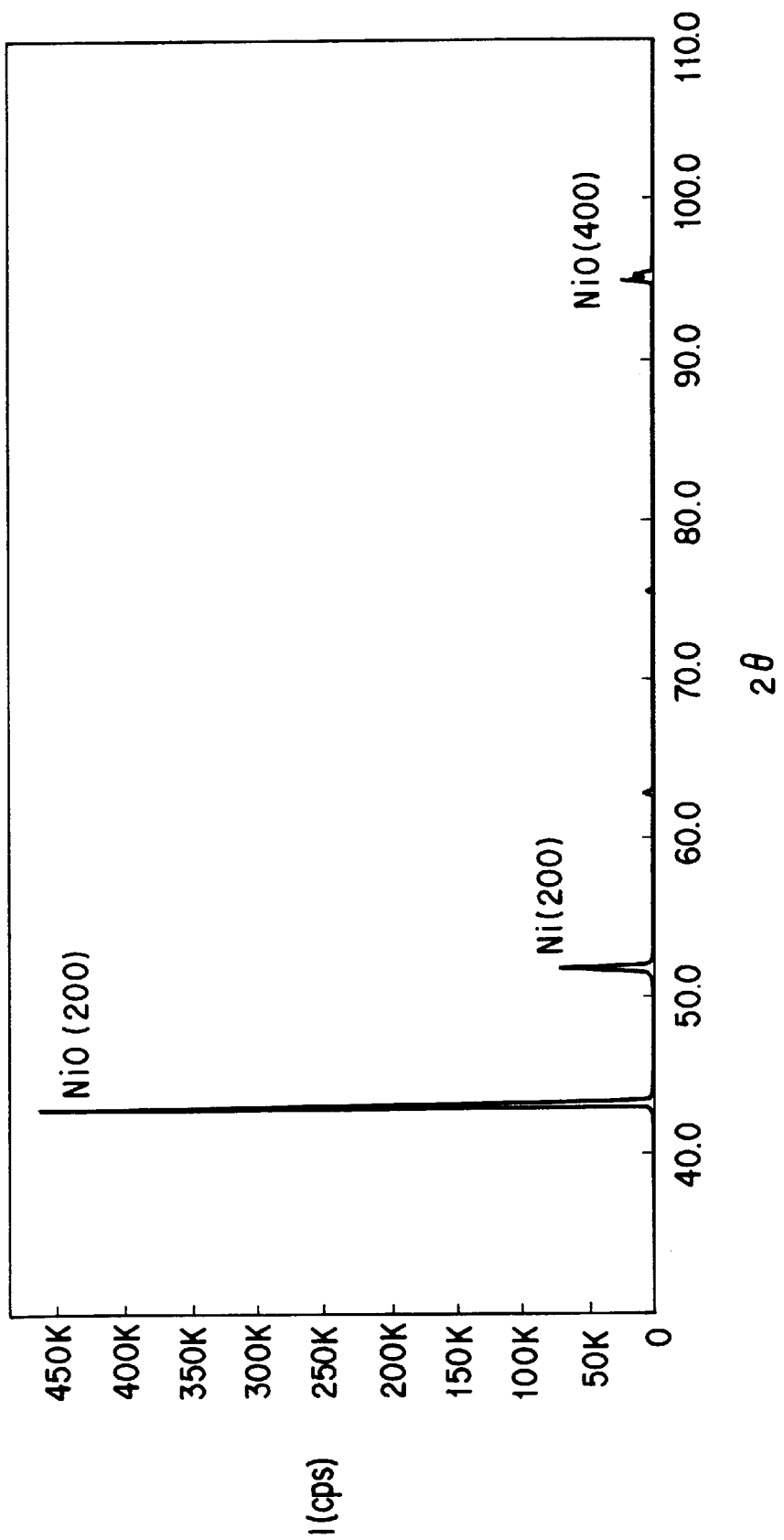
FIG. 1 is a graph showing an X-rays diffraction pattern of a Ni/NiO tape which was obtained in one example of this invention.

The superconductor according to this invention is featured in that it comprises a polycrystalline metallic substrate having a rolled textured structure where the {100} plane thereof is parallel with a rolled plane and the <001> axis thereof is parallel with a rolled direction, an oxide crystal layer consisting of an oxide of the polycrystalline metal which is formed on the surface of the polycrystalline metallic substrate; and an oxide superconductor layer formed on a surface of the oxide crystal layer; and in that 90% or more of the {100} plane of the oxide crystal layer is inclined at most at an angle of not more than 10° to the surface of the polycrystalline metallic substrate.

As for the metal constituting the polycrystalline metallic substrate in the superconductor wire constructed as mentioned above, a metal which is high in melting point, excellent in workability, and capable of being easily formed into a textured structure can be employed. Examples of such a metal are nickel, copper, cobalt, chromium, magnesium, etc. Further, depending on the end-use, a nickel alloy which is reduced in magnetism and modified in workability thereof by the addition of chromium, vanadium, silicon, aluminum, zinc or copper may be employed.

Further, a composite material comprising two or more kinds of aforementioned metals and alloys may be employed. Specific examples of the composite material are a combination of nickel/nickel alloy, a combination of nickel/copper, and a combination of nickel/copper alloy. In this case, the outermost layer of the wire should preferably be constituted by nickel in order to utilize the textured structure of nickel.

The polycrystalline metallic substrate is formed into a cubic textured structure having a crystal plane of {100} and a crystal axis of <001> by means of rolling and heat treatment. The heat treatment can be performed in a non-oxidizing atmosphere at a temperature of 900° C. or more, preferably 900° C. to 1,100° C. If the temperature of heat treatment is less than 900° C., it is difficult to obtain a clear {100} <001> orientation and hence undesirable.

The oxide crystal layer formed on the polycrystalline metallic substrate is constituted by an oxide of the aforementioned metals. Therefore, depending on the specific material of the polycrystalline metallic substrate, an oxide such as nickel oxide (NiO), copper oxide ($Cu_2O$), cobalt oxide (CoO), chromium oxide ($Cr_2O_3$), magnesium oxide (MgO), etc. can be employed. The oxide crystal layer can be formed by heat-treating the polycrystalline metallic substrate in an oxidizing atmosphere at a temperature of 1,000° C. or more, more preferably 1,000° C. to 1,300° C. If the temperature of the heat treatment is less than 1,000° C., it would be impossible to obtain an oxide crystal wherein 90% or more of the {100} plane of the oxide crystal is approximately parallel with the surface of the polycrystalline metallic substrate, i.e. it is inclined at most at an angle of not more than 10° to the surface of the polycrystalline metallic substrate, thus making it impossible to achieve a high critical current density.

As explained above, when the polycrystalline metallic substrate is heat-treated in an oxidizing atmosphere, the oxide layer to be formed therefrom is influenced by the features of the surface of the polycrystalline metallic substrate, so that an oxide crystal layer wherein 90% or more of the {100} plane of the oxide crystal layer is approximately parallel with the surface of the polycrystalline metallic substrate, i.e. it is inclined at most at an angle of not more than 10° to the surface of the polycrystalline metallic substrate can be obtained. The thickness of this oxide crystal layer should preferably be in the range of from 1 to 300 μm.

As for the oxide superconductor to be formed on the oxide crystal layer, any material containing a rare earth element, having a perovskite structure and being capable of realizing a superconductive state can be employed. Specific example of such an oxide superconductor is $REBa_2Cu_3O_{7-y}$ (wherein RE is at least one kind of element selected from rare earth elements such as La, Eu, Gd, Dy, Ho, Er, Tm, Yb, etc.; and y denotes oxygen deficiency and is 1 or less in general).

If required in view of crystal conformity, etc., an additional oxide layer such as yttria-stabilized zirconia (YSZ), cerium oxide ($CeO_2$), strontium oxide ($SrTiO_2$) or magnesium oxide (MgO) may be formed on the oxide crystal layer as a second intermediate layer prior to the formation of the oxide superconductor layer. In this case, this second intermediate layer is also influenced by the surface features of the polycrystalline metallic substrate, whereby making it possible to easily form a crystal layer of high orientation degree. The thickness of this second intermediate layer should preferably be in the range of from 0.05 to 5 μm.

The following is a detailed description of specific embodiments of this invention.

The formation of a superconductor layer on the surface of oxide crystal layer formed on a polycrystalline metallic substrate can be performed by means of a vapor phase method such as a laser ablation, chemical vapor deposition, electron beam deposition, and sputtering, or a liquid phase method such as a liquid phase epitaxial growth and a sol-gel method.

According to the laser ablation method in general, it is possible to perform the growth of an oxide superconductor at a high speed. However, in order to obtain a film of high quality, the substrate is required to be kept at a high temperature ranging from 700 to 800° C. On the other hand, according to the liquid phase epitaxial growth method enabling a high film growth rate to be achieved, the substrate is dipped in a melt of high temperature ranging from 900 to 1,000° C., so that it is difficult to form an oxide superconductor layer directly on a metal substrate of low melting point. Therefore, it is fundamentally required to employ a metal substrate having a higher melting point than that of the oxide superconductor.

Further, since a metal is generally oxidized at a very fast rate in an oxidizing atmosphere, a diffusion barrier layer is required to be interposed as an intermediate layer between an oxide superconductor layer and a metal substrate. Furthermore, since an oxide superconductor layer is formed on this intermediate layer, a crystallographical conformity is required to exist between them, so that the intermediate layer is required to have a specific crystal orientation exhibiting a suitable lattice constant.

One example of such a metallic material meeting the aforementioned conditions is nickel. When nickel is oxidized at a high temperature, only nickel oxide (NiO) of simple structure is formed. This nickel oxide is a stable oxide just like MgO, and exhibits a crystal of cubic system with its lattice constant being 4.16 angstroms or close to that of MgO. This invention makes the most of such a high melting point metal as nickel.

The present inventors have found the phenomena that when the aforementioned nickel metal substrate is subjected to a roll working and a heat treatment in a non-oxidizing atmosphere, a cubic textured structure having the {100} <001> orientation is formed, and that when the metal substrate of this cubic textured structure is then subjected to an oxidation heat treatment at a temperature of 1,000° C. or more, a dense and smooth NiO layer being influenced by the underlying surface and hence having a {100} plane which is approximately parallel with or inclined at most at an angle of not more than 10° to the surface of the nickel metal substrate is formed on the {100} plane of the nickel metal substrate within a short period of time. Further, it has been found by the present inventors that the NiO crystal thus formed is highly orientated also in the plane thereof. These facts act advantageously on the aspect of improving the $J_c$ of the oxide superconductor. This invention has been accomplished based on these findings.

Since the melting point of NiO is as high as 2,000° C., NiO is very stable even if it is exposed to a temperature ranging from 800 to 1,000° C. Further, once the NiO layer is formed, the NiO layer acts as a diffusion barrier, so that the oxidation rate of the nickel metal substrate is rapidly decreased. Further, since the diffusion of nickel into the NiO is extremely slow, the diffusion of nickel into an oxide superconductor layer at the occasion of forming the oxide superconductor layer can be suppressed to a negligible level.

The NiO layer formed on the nickel metal substrate can be utilized, as in the case of the intermediate layer to be utilized in other methods, as a diffusion barrier or as an orientated substrate suited for the formation of an oxide superconductor layer. However, one of the most important features of this invention resides in that it is possible to obtain an oxide intermediate layer which is prominently orientated in a specific crystal direction by simply heat-treating a textured-structured metal substrate in an oxidizing atmosphere.

A vacuum atmosphere as required in the conventional methods is no more required in the method of this invention, and the heat treatment can be accomplished within a time period of several tens minutes to several hours, so that a continuous metal substrate can be treated all at once in a single electric furnace. Accordingly, it is possible according to this invention to manufacture a large quantity of continuous metal substrate tape in an extremely short period of time as compared with the other conventional methods. Therefore, the metal substrate provided with an oxide intermediate layer that can be obtained according to this invention is suited for a mass production and also suited for use as a metal substrate for manufacturing a practical wire.

As explained above, if it is desired to control the crystal conformity or crystal orientation, a second intermediate layer consisting of an oxide such as YSZ, $CeO_2$, strontium titanate or MgO may be formed on the surface of the NiO layer. This second intermediate layer can be formed by means of a laser ablation method, a sputtering method, a chemical vapor deposition method, an electron beam deposition, or a sol-gel method.

Further, if an AC current loss due to the magnetism of nickel is to be reduced, it can be realized by adding chromium, vanadium, silicon, aluminum, zinc or copper to the nickel. The resultant nickel alloy which is concurrently modified in workability can be employed as a starting material for the transformation thereof into a textured structure and for the formation of a NiO layer.

Furthermore, the nickel may be combined with other kinds of metal or the aforementioned alloys (such as nickel/chromium, nickel/vanadium, nickel/silicon, nickel/aluminum, nickel/zinc, nickel/copper, etc. thereby to form a composite, and then the nickel may be alloyed through a diffusion during the heat treatment for forming a NiO layer, thereby decreasing the magnetism of the nickel. In this case, the outermost layer of the composite body should preferably be constituted by a nickel layer.

The aforementioned methods may be carried out by employing metals other than nickel, i.e. copper, cobalt, chromium, magnesium, etc. whereby obtaining the substantially the same effects.

As explained above, it is possible according to this invention to provide, through a simple method, a highly orientated intermediate layer on the surface of a polycrystalline metallic substrate having a predetermined crystal orientation. Due to the provision of this intermediate layer, it has become possible to adopt even a manufacturing process requiring such a high temperature as close to the melting point of an oxide superconductor, such as a laser ablation method or a liquid phase epitaxial method. As a result, an oxide superconductor wire comprising a superconductor film exhibiting a high critical current density can be easily manufactured at a higher manufacturing speed as compared with the conventional methods.

The following are specific examples of this invention illustrating this invention more concretely.

EXAMPLE 1

First of all, a nickel tape having a cubic textured structure was manufactured. Specifically, a nickel (purity: 99.9%) rod having a diameter of 10 mm and being available on the market was roll-worked to reduce the thickness thereof to 0.15 mm, thus obtaining the nickel tape. Then, the tape was annealed in an argon atmosphere at a temperature of 900 to 1,000° C. for 1 to 2 hours. When the crystal orientation of this nickel tape was investigated by means of an X-ray diffraction, the textured structure of the nickel tape was confirmed wherein 90% or more of the {100} plane of the crystal grains was recognized as being parallel with the surface of the tape, and the <001> axis thereof was also recognized as being parallel with a rolled direction.

Then, the tape was heat-treated in an oxygen atmosphere for one to two hours while changing the heating temperature within a range of 800 to 1,300° C., thus forming a NiO layer on the surface of the nickel tape. When the heat treatment was performed at a lower temperature, a NiO layer where <111>, <110> and <001> axes were existed in a mixed manner was grown. However, the temperature of the heat treatment was set to 1,000° C. or more, only the <001> axis was developed, thus making it possible to obtain an orientated crystal where 90% or more of the {100} plane of the NiO crystal was almost parallel with or inclined at most at an angle of 10° or less to the surface of the nickel tape. A typical example of the X-ray diffraction pattern of the crystal thus obtained is shown in FIG. 1.

Figure 2:
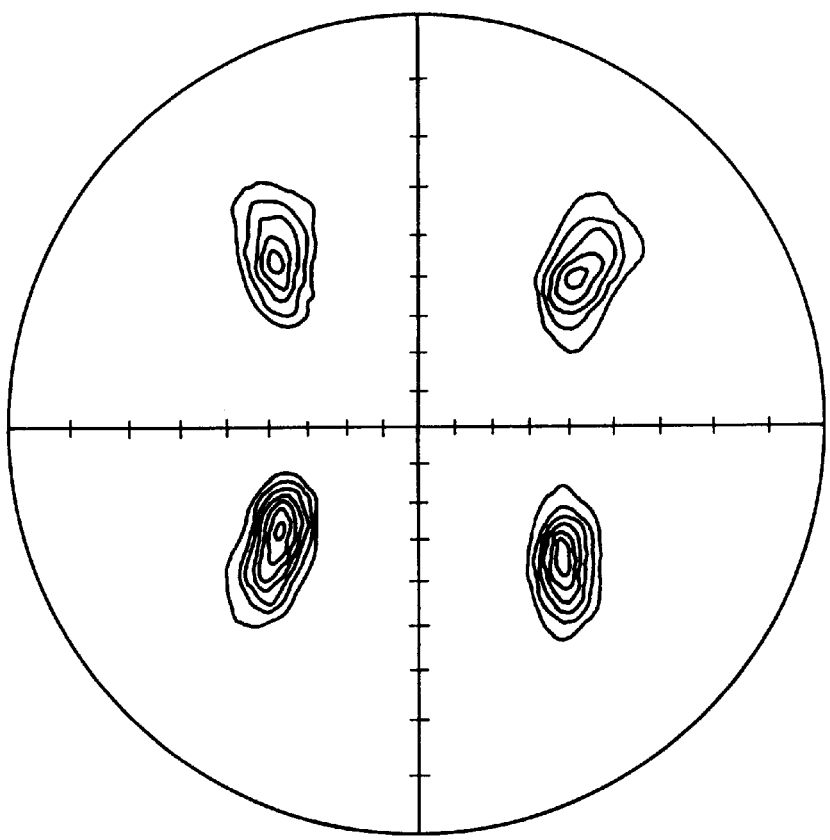
FIG. 2 is a pole figure of the NiO crystal (111) plane of a Ni/NiO tape which was obtained in one example of this invention.
Figure 3:
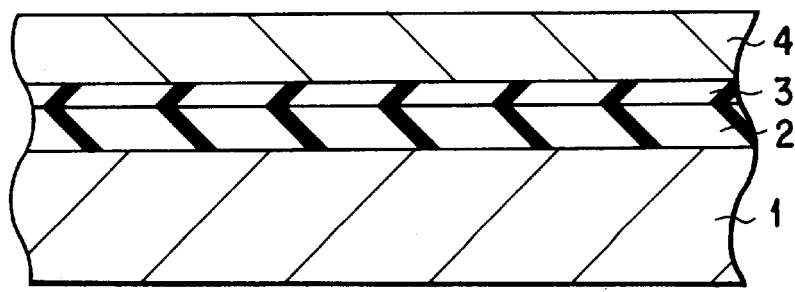
FIG. 3 is a cross-sectional view showing an oxide superconductor tape according to another example of this invention.

The pole figure of the NiO crystal obtained in this method and orientated in <001> axis was measured to confirm that the crystal is highly orientated even in the plane thereof. A typical example of the pole figure of the crystal thus obtained is shown in FIG. 2.

Then, a Y123 oxide superconductor layer was formed on the {100} plane of the Ni/NiO tape thus obtained by means of a laser ablation method employing a KrF excimer laser. The formation of the oxide superconductor layer was performed by setting the temperature of the substrate to 600 to 800° C. and by changing the oxygen gas pressure (atmospheric gas) within the range of 1 to 200 mTorr, thus depositing the Y123 oxide 0.4 μm in thickness. The energy density of the laser in this deposition process was set to 2 to 3 J/cm² and the repetitive frequency of the laser was set to 5 to 15 Hz.

The Y123 oxide superconductor layer thus obtained exhibited an orientation where the c-axis thereof was perpendicular to the surface of the tape throughout the entire tape. There was recognized a tendency that a- and b-axes were orientated in the plane of the tape. Further, the orientation property of the Y123 oxide superconductor layer was found dependent to a great extent on the orientation of the underlying NiO crystal.

When the tape-like wires obtained after the deposition of the Y123 oxide superconductor layer on various NiO crystals which were formed through an oxidation at various heat treatment temperature were subjected to a test for measuring the $J_c$ under the conditions of 77 K and zero tesla, the following results as shown in Table 1 were obtained.

TABLE 1

| Temp. of heat treatment for forming NiO | Ratio of NiO crystal whose (100) plane is parallel (10° or less) with tape surface (%) | Jc (× 10⁶A/cm²) 77K, zero tesla |
|---|---|---|
| 800 | 12 | 0.002 |
| 900 | 38 | 0.01 |

TABLE 1-continued

| Temp. of heat treatment for forming NiO | Ratio of NiO crystal whose (100) plane is parallel (10° or less) with tape surface (%) | Jc (× 10⁶A/cm²) 77K, zero tesla |
|---|---|---|
| 1000 | 90 | 0.2 |
| 1100 | 91 | 0.4 |
| 1200 | 95 | 0.5 |
| 1300 | 94 | 0.5 |

It will be understood from the Table shown above that the value of the $J_c$ was greatly influenced by the temperature for forming the NiO crystal. It will be also understood from the Table that when the NiO crystal is formed at an oxidation heat treatment temperature of 1,000° C. or more, the $J_c$ which is almost comparable to those to be obtained in the conventional IBAD method or RABiTS method can be obtained.

EXAMPLE 2

A Ni/NiO tape having a cubic textured structure was manufactured in the same manner as set forth in Example 1. Then, an oxide superconductor layer was formed on the surface of the Ni/NiO tape by means of a liquid phase epitaxial growth method. Namely, a Y123 layer was first formed as a seed crystal on the {100} plane of the NiO layer thus obtained through the orientated crystal growth. Subsequently, an additional Y123 layer was further deposited on the seed crystal by means of a liquid epitaxial growth method, thereby to obtain a Y123 layer having a thickness of 3 μm. In this film formation, the temperature thereof was set to 920 to 960° and the time thereof was set to 2 minutes.

When the crystal orientation of the oxide superconductor layers thus obtained were analyzed by means of X-ray diffraction, the c-axis in all of the oxide superconductors was found as being parallel with the surface of the tape throughout the entire tape. Further, when the in-plane orientation of the oxide superconductors was analyzed from the pole figure of the X-ray diffraction, all of the samples indicated a tendency of in-plane orientation. When this tape-like wire was tested for measuring the $J_c$ under the conditions of 77 K and zero tesla, it indicated a value of as high as 0.15×10⁶ A/cm².

EXAMPLE 3

A Ni/NiO tape consisting of a Ni substrate 1 and a NiO layer 2 as shown in FIG. 1 and having a cubic textured structure was manufactured in the same manner as set forth in Example 1. Then, an YSZ layer 3 having a thickness of 0.2 μm was formed on the {100} plane of the NiO layer 2 of the Ni/NiO tape by means of a sputtering method. Subsequently, a Y123 oxide superconductor layer 4 was formed by means of a laser ablation method employing a KrF excimer laser.

The formation of the oxide superconductor layer 4 was performed by setting the temperature of the substrate to 600 to 800° C. and by changing the oxygen gas pressure (atmospheric gas) within the range of 1 to 200 mTorr, thus depositing the Y123 oxide 4 having a thickness of 0.4 μm. The energy density of the laser in this deposition process was set to 2 to 3 J/cm² and the repetitive frequency of the laser was set to 5 to 15 Hz.

The Y123 oxide superconductor layer 4 thus obtained exhibited an orientation where the c-axis thereof was perpendicular to the surface of the tape throughout the entire tape. There was recognized a tendency that the a- and b-axes were orientated in the plane of the tape. When this tape-like wire was tested for measuring the $J_c$ under the conditions of 77 K and zero tesla, it indicated a value of as high as 0.6×10⁶ A/cm², which was almost comparable to those to be obtained in the conventional IBAD method or RABiTS method.

EXAMPLE 4

A Ni/NiO tape having a cubic textured structure was manufactured in the same manner as set forth in Example 1. Then, a MgO layer having a thickness of 0.5 μm was formed on the {100} plane of the orientated NiO layer of the Ni/NiO tape by means of a sputtering method. Then, a Y123 layer was formed as a seed crystal on the MgO layer by means of a laser ablation method. Subsequently, an additional Y123 layer was further deposited on the seed crystal by means of a liquid epitaxial growth method, thereby to obtain a Y123 layer having a thickness of 3 μm. In this film formation, the temperature thereof was set to 920 to 960° C.

When the crystal orientation of the oxide superconductor layers thus obtained were analyzed by means of X-ray diffraction, the c-axis in all of the oxide superconductors was found as being parallel with the surface of the tape throughout the entire tape. Further, when the in-plane orientation of the oxide superconductors was analyzed from the pole figure of the X-ray diffraction, all of the samples indicated an in-plane orientation. When this tape-like wire was tested for measuring the $J_c$ under the conditions of 77 K and zero tesla, it indicated a value of as high as 0.2×10⁶ A/cm².

EXAMPLE 5

First of all, a copper tape having a cubic textured structure was manufactured. Specifically, a copper (purity: 99.9%) rod having a diameter of 10 mm and being available on the market was roll-worked to reduce the thickness thereof to 0.15 mm, thus obtaining the copper tape. Then, the tape was annealed in an argon atmosphere at a temperature of 500 to 1,000° C. for one hour. When the crystal orientation of this copper tape was investigated by means of an X-ray diffraction, the textured structure of the copper tape was confirmed wherein 95% or more of the {100} plane of the crystal grains was recognized as being parallel with the surface of the tape, and the <001> axis thereof was also recognized as being parallel with a rolled direction.

Then, the tape was heat-treated in an oxygen atmosphere for one hour at a temperature ranging from 500 to 800° C., thus forming a $Cu_2O$ layer 2 μm in thickness on the surface of the copper tape. Then, a Y123 oxide superconductor layer having a thickness of 0.4 μm was formed in the same manner as explained in Example 1 on the {100} plane of the $Cu/Cu_2O$ tape thus obtained by means of a laser ablation method employing a KrF excimer laser.

When this tape-like wire was tested for measuring the $J_c$ under the conditions of 77 K and zero tesla, it indicated a value of 0.1×10⁶ A/cm².

EXAMPLE 6

A copper rod was inserted into a nickel pipe having a diameter of 20 mm and then subjected to a swaging and a rolling to manufacture a nickel/copper composite tape having a thickness of 0.2 mm. Then, the tape was annealed in an argon atmosphere at a temperature of 900° C. for one hour to form a nickel/copper-nickel alloy/copper composite tape. This copper-nickel alloy layer was formed through a diffusion of metals during the heat treatment.

When the crystal orientation of the nickel layer constituting the outermost layer was investigated by means of an X-ray diffraction, it was confirmed that 95% or more of the {100} plane of the crystal grains was parallel with the surface of the tape, and the <001> axis thereof was also parallel with a rolled direction.

Then, the tape was subjected to an oxidizing treatment in an oxygen atmosphere for 0.5 to 1 hour at a temperature ranging from 1,000 to 1,200° C., thus forming a NiO layer on the surface of the nickel layer. The {100} plane of the NiO crystal thus obtained was found as being orientated parallel with the underlying surface. Then, the X-ray pole figure of the NiO crystal was measured, thus confirming that the crystal is highly orientated even in the plane thereof.

Then, a Y123 oxide superconductor layer was formed on the NiO layer by means of a laser ablation method employing a KrF excimer laser. The formation of the oxide superconductor layer was performed by setting the temperature of substrate to 600 to 800° C. and by changing the oxygen gas pressure (atmospheric gas) within the range of 1 to 200 mTorr, thus depositing the Y123 oxide 0.4 $\mu$m in thickness. The energy density of the laser in this deposition process was set to 2 to 3 J/cm$^2$ and the repetitive frequency of the laser was set to 5 to 15 Hz.

The Y123 oxide superconductor layer thus obtained exhibited an orientation where the c-axis thereof was perpendicular to the surface of the tape throughout the entire tape. There was recognized a tendency that the a- and b-axes were orientated in the plane of the tape. Further, when the construction of underlying layer existing underneath this Y123 layer was investigated, a pure nickel layer was not recognized due to the interdiffusion between the copper and the nickel, and hence the underlying layer was all turned into a copper-nickel alloy.

When this wire was tested for measuring the $J_c$ under the conditions of 77 K and zero tesla, it indicated a value of 0.3×10$^6$ A/cm$^2$, which was almost comparable to those to be obtained in the conventional IBAD method or RABiTS method. Further, when the AC current loss of this wire was evaluated by measuring the magnetism thereof, it was confirmed that the current loss was minimized by at least 1/10 as compared with the superconductor wire employing only pure nickel. This can be ascribed to the fact that the nickel was alloyed with copper, thus reducing the ferromagnetism of the nickel.

EXAMPLE 7

A nickel-20% chromium alloy rod was inserted into a nickel pipe having a diameter of 20 mm and then subjected to a swaging and a rolling to manufacture a nickel/nickel-chromium alloy composite tape having a thickness of 0.2 mm. Then, the tape was annealed in an argon atmosphere at a temperature of 900° C. for one hour.

When the crystal orientation of the nickel layer constituting the outermost layer was investigated by means of an X-ray diffraction, it was confirmed that 95% or more of the {100} plane of the crystal grains was parallel with the surface of the tape, and the <001> axis thereof was also orientated parallel with a rolled direction.

Then, the tape was subjected to an oxidizing treatment in an oxygen atmosphere for 0.5 to 1 hour at a temperature ranging from 1,000 to 1,200° C., thus forming a NiO layer on the surface of the nickel layer. The {100} plane of the NiO crystal thus obtained was found as being orientated parallel with the underlying surface. Then, the X-ray pole figure of the NiO crystal was measured, thus confirming that the crystal is highly orientated even in the plane thereof.

Then, in the same manner as in Example 6, a Y123 oxide superconductor layer having a thickness of 0.4 $\mu$m was formed on the NiO layer by means of a laser ablation method employing a KrF excimer laser. The Y123 oxide superconductor layer thus obtained exhibited an orientation where the c-axis thereof was perpendicular to the surface of the tape throughout the entire tape. The a- and b-axes were found orientated in the plane of the tape.

Further, when the construction of underlying layer existing underneath this Y123 layer was investigated, a pure nickel layer was not recognized due to the interdiffusion between the copper and the nickel, i.e. the underlying layer was all turned into a copper-nickel alloy, and the generations of chromium oxide and nickel-chromium oxide were also found in part of the NiO layer.

When this wire was tested for measuring the $J_c$ under the conditions of 77 K and zero tesla, it indicated a value of 0.4×10$^6$ A/cm$^2$.

Further, when the AC current loss of this wire was evaluated by measuring the magnetism thereof, it was confirmed that the current loss was minimized by 1/50 to 1/100 or less as compared with the superconductor wire employing only pure nickel. This can be ascribed to the fact that the nickel was alloyed with chromium, thus reducing the ferromagnetism of the nickel.

Comparative Example

In the same manner as Example 1, a nickel tape was manufactured. Specifically, a nickel (purity: 99.9%) rod having a diameter of 10 mm and being available on the market was roll-worked to reduce the thickness thereof to 0.15 mm, thus obtaining the nickel tape. Then, the tape was annealed in an argon atmosphere at a temperature of 1,000° C. for 3 hours. When the crystal orientation of this nickel tape was investigated by means of an X-ray diffraction, the textured structure of the nickel tape was confirmed wherein about 95% or more of the {100} plane of the crystal grains was recognized as being parallel with the surface of the tape, and the <001> axis thereof was also recognized as being parallel with a rolled direction.

Then, by making use of a laser ablation method as in the case of Example 1, a Y123 oxide superconductor layer having a thickness of 0.4 $\mu$m was formed directly on the surface of the tape without forming a NiO layer on the surface of the tape.

The Y123 superconductor layer thus obtained exhibited an orientation of the c-axis thereof throughout the entire tape. However, the in-plane orientation was not recognized.

When this tape was tested for measuring the $J_c$ under the conditions of 77 K and zero tesla, it indicated a low value of 3×10$^3$ A/cm$^2$.

As explained above, according to this invention, a polycrystalline metallic substrate which has been worked to exhibit a predetermined crystal orientation through a rolling and a heat treatment is subjected at first to an oxidizing heat treatment thereby to form a highly orientated oxide film, and then an oxide superconductor layer is formed on the surface of this orientated oxide film. Therefore, it is possible to adopt a manufacturing process which requires such a high temperature as close to the melting point of the oxide superconductor, such as a laser ablation method or a liquid epitaxial method. Accordingly, it is now possible to easily manufacture an oxide superconductor wire comprising a superconductor film exhibiting a high critical current density at a higher manufacturing speed as compared with the conventional methods.

Further, since a composite material or an alloy is employed as a polycrystalline metallic substrate, the magnetism of a single metallic substance constituting the substrate can be reduced, thus making it possible to minimize the AC current loss.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a superconductor wire which comprises the steps of:

rolling a polycrystalline metallic substrate;

heating the rolled polycrystalline metallic substrate at a temperature of 900° C. or more in a non-oxidizing atmosphere, whereby obtaining a rolled textured structure which is orientated such that the {100} plane thereof is parallel with a rolled plane and the <001> axis thereof is parallel with a rolled direction;

heating the polycrystalline metallic substrate of the rolled textured structure at a temperature of 1,000° C. or more in an oxidizing atmosphere, whereby forming an oxide crystal layer consisting essentially of an oxide of the polycrystalline metal; and forming an oxide superconductor layer on the oxide crystal layer.

2. The method of manufacturing a superconductor wire according to claim 1, wherein said oxide superconductor layer is formed on said oxide crystal layer by a laser ablation method.

3. The method of manufacturing a superconductor wire according to claim 1, wherein said oxide superconductor layer is formed on said oxide crystal layer by a liquid phase epitaxial growth method.

4. The method of manufacturing a superconductor wire according to claim 3, wherein said polycrystalline metallic substrate has a melting point which is not lower than that of said oxide superconductor.

5. The method of manufacturing a superconductor wire according to claim 1, wherein said polycrystalline metal is at least one metal or alloy selected from the group consisting of nickel, copper, cobalt, chromium, magnesium, an alloy containing nickel as a main component and a composite material comprising at least two of said metal or said alloy.

6. The method of manufacturing a superconductor wire according to claim 5, wherein said polycrystalline metal is nickel or alloy containing nickel as a main component, and said oxide of polycrystalline metal comprises mainly a nickel oxide.

7. The method of manufacturing a superconductor wire according to claim 5, wherein said polycrystalline metal is copper or alloy containing copper as a main component, and said oxide of polycrystalline metal comprises mainly a copper oxide.

8. The method of manufacturing a superconductor wire according to claim 5, wherein said polycrystalline metal is a composite material comprising a combination of nickel and a nickel alloy; a combination of nickel and copper; or a combination of nickel and a copper alloy, and an outermost layer thereof is constituted by nickel.

9. The method of manufacturing a superconductor wire according to claim 1, wherein said oxide crystal layer has a thickness of 1 to 300 μm.

10. The method of manufacturing a superconductor wire according to claim 1, wherein said oxide superconductor layer is comprises an oxide superconductor containing a rare earth element and which exhibits a perovskite structure.

11. The method of manufacturing a superconductor wire according to claim 1, which further comprises forming an oxide layer between said oxide crystal layer and said oxide superconductor layer; said oxide layer being selected from the group consisting of yttria-stabilized zirconia (YSZ) layer, cerium oxide ($CeO_2$) layer, strontium oxide ($SrTiO_2$) layer and magnesium oxide (MgO) layer.

12. The method of manufacturing a superconductor wire according to claim 4, wherein said oxide layer has a thickness of 0.05 to 5 μm.

13. The method of manufacturing a superconductor wire according to claim 1, wherein the heating of the rolled polycrystalline metallic substrate is carried out at a temperature of 900° C. to 1,100° C.

14. The method of manufacturing a superconductor wire according to claim 13, wherein the heating of the polycrystalline metallic substrate is carried out at a temperature of 1,000° C. to 1,300° C.

15. The method of manufacturing a superconductor wire according to claim 14, wherein said oxide superconductor layer comprises $REBa_2CU_3O_{7-y}$, said RE being a rare earth element selected from the group consisting of La, Eu, Gd, Dy, Ho, Er, Tm and Yb and said y is 1 or less.

16. The method of manufacturing a superconductor wire according to claim 15, wherein said oxide superconductor layer is formed on said oxide crystal layer by a method selected from the group consisting of a laser ablation method and a liquid phase epitaxial growth method.

17. The method of manufacturing a superconductor wire according to claim 16, wherein said polycrystalline metallic substrate has a melting point which is not lower than that of said oxide superconductor.

18. The method of manufacturing a superconductor wire according to claim 17, wherein said oxide crystal layer has a thickness of 1 to 300 μm.

* * * * *